United States Patent [19]

Bärmann

[11] Patent Number: 4,741,472

[45] Date of Patent: May 3, 1988

[54] METHOD OF SOLDERING AN INTEGRATED CIRCUIT AND PRINTED CIRCUIT BOARD

[75] Inventor: Dieter Bärmann, Hersbruck, Fed. Rep. of Germany

[73] Assignee: Grundig E.M.V. Elektro-Mechanische Versuchsanstalt Max Grundig, Fuerth/Bay., Fed. Rep. of Germany

[21] Appl. No.: 890,901

[22] Filed: Jul. 28, 1986

[30] Foreign Application Priority Data

Jul. 27, 1985 [DE] Fed. Rep. of Germany ....... 3527043

[51] Int. Cl.⁴ .................. B23K 31/00; B23K 31/02
[52] U.S. Cl. .................. 228/180.1; 228/180.2; 228/179
[58] Field of Search .......... 228/179, 180.1, 180.2, 228/212; 339/17 CF, 17 E; 361/395; 29/832, 837, 840, 842, 843, 844, 845

[56] References Cited

U.S. PATENT DOCUMENTS

| 3,796,921 | 3/1974 | Fischer | 339/17 CF |
| 4,110,917 | 9/1978 | LeGrelle | 339/17 CF |
| 4,222,622 | 9/1980 | Griffin et al. | 339/17 CF |
| 4,272,140 | 6/1981 | Lychyk et al. | 339/17 CF |
| 4,326,765 | 4/1982 | Brancaleone | 339/17 CF |
| 4,346,952 | 8/1982 | Bright et al. | 339/17 CF |
| 4,538,864 | 9/1985 | Ichimura | 339/17 CF |
| 4,541,676 | 9/1985 | Hansen et al. | 339/17 CF |
| 4,556,267 | 12/1985 | Senor | 339/17 CF |
| 4,557,540 | 12/1985 | Forbes et al. | 339/17 CF |
| 4,566,624 | 1/1986 | Comerford | 228/37 |
| 4,582,245 | 4/1986 | Cartwright | 228/180.2 |
| 4,630,875 | 12/1986 | Korsunsky | 339/17 CF |

Primary Examiner—M. Jordan
Attorney, Agent, or Firm—Kane, Dalsimer, Sullivan, Kurucz, Levy, Eisele and Richard

[57] ABSTRACT

A method of soldering an integrated circuit with yielding connecting contacts rigidly mounted on the integrated circuits to printed circuit boards. The integrated circuit is inserted in a clamped manner into a formed opening in a printed circuit board and the connecting contacts are soldered with the conductors by means of customary soldering methods for mass production such as by wave soldering.

6 Claims, 1 Drawing Sheet

METHOD OF SOLDERING AN INTEGRATED CIRCUIT AND PRINTED CIRCUIT BOARD

FIELD OF THE INVENTION

The present invention relates to a method of soldering an integrated circuit on a printed circuit board.

BACKGROUND OF THE INVENTION

Printed circuit boards and integrated circuit are well known. It is further know that integrated circuits, usually of a rectangular shape, are plugged into openings of a printed circuit board by way of stationary connecting pins and are then soldered together with the associated conductors of the printed circuit board.

Integrated circuits are also known under the customary name PCC (plastic chip carrier), having plastic housings which are provided with contacts on their circumferential sides. These integrated circuits are plugged into a printed circuit board usually by way of an expensive contact support. The support is soldered onto the printed circuit board by way of a known soldering method (for example, immerse soldering) through the use of stationary soldering pins. A direct soldering of a PCC-building block to the conductor side of the printed circuit board is usually only possible through the use of relatively expensive soldering devices and by using a soldering paste applied on the specific soldering points by means of a printing method. Accordingly, the use of such building blocks in a printed circuit is somewhat limited due to the cost and relatively delicate steps involved. Accordingly, there exists a need for a system of coupling an integrated circuit to a printed circuit which avoids the use of additional supporting members and relatively intricate soldering techniques.

SUMMARY OF THE INVENTION

It is therefor the principal object of the invention to provide for a method of soldering an integrated circuit such as a PCC building block which is relatively simple and inexpensive.

It is a further object of the invention to provide for such a method of soldering which avoids the use of additional soldering support members but allows a direct soldering of the integrated circuit to the printed circuit board directly along with other parts that may be on the board.

Accordingly, the present invention provides for an integrated circuit or building block having a plurality of yieldable contacts positioned about its parameter. This integrated circuit is then inserted into a cut out portion in the printed circuit board. The contacts serve to abut the sides of the cut out in a friction engagement so as to maintain the circuit in position for soldering, which can then take place by way of typical mass production soldering methods, particularly wave soldering.

BRIEF DESCRIPTION OF THE DRAWINGS

Thus by the present invention, its objects and advantages will be realized, the description of which should be taken in conjunction with the drawings, wherein.

DETAILED DESCRIPTION OF THE PREFERRED EMBODIMENT

Figure 1:
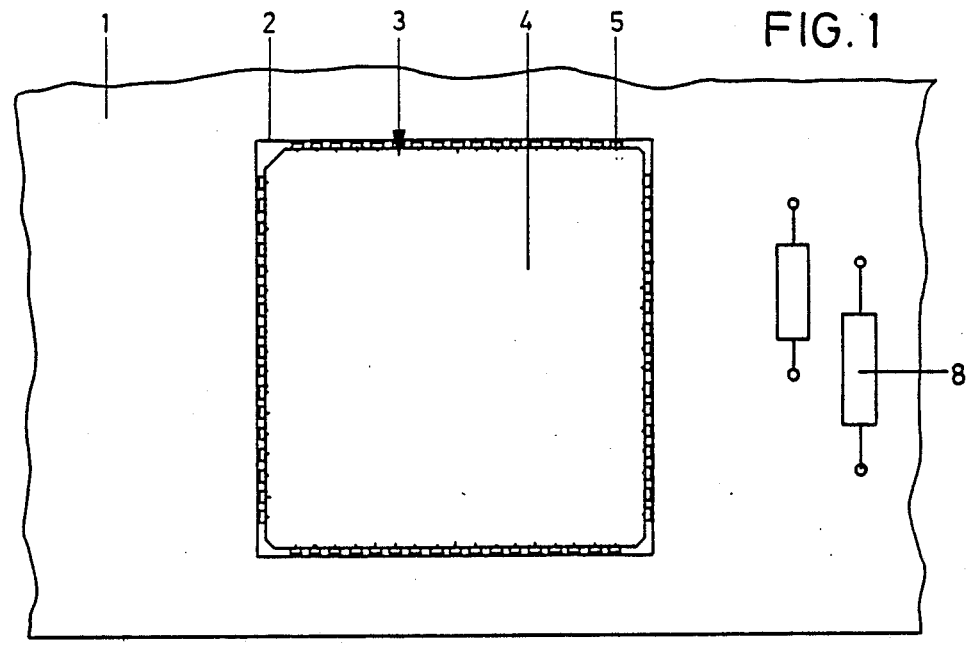
FIG. 1 is a plan view of a printed circuit board with an integrated circuit building block soldered thereto, incorporating the teachings of the present invention.

More particularly now with respect to the drawings, in FIG. 1 there is shown a printed circuit board 1. The board is provided with a rectangular opening 2 which may be cut out of or stamped from the board. Into the opening 2 there is intended to be inserted an integrated circuit 3 such as that of the PCC type which is of a shape that corresponds to that of the opening 2.

Figure 2:
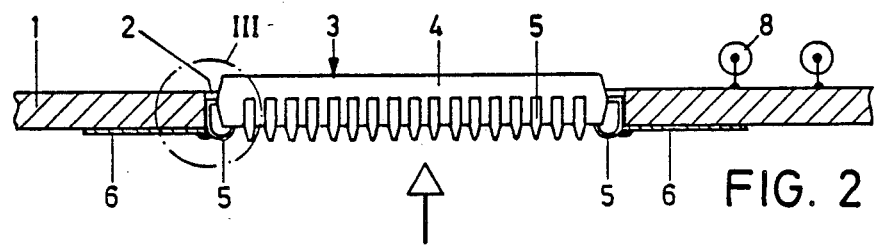
FIG. 2 is a partial sectional view of that shown in FIG. 1.
Figure 3:
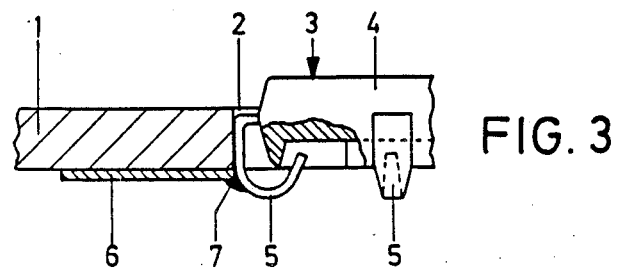
FIG. 3 is an enlarged sectional view of the arrangement of area III shown in FIG. 2.

The integrated circuit 3, when in the opening 2, is in position to be soldered together with associated conductors 6 positioned on the reverse side of the printed circuit board 1 as shown in FIGS. 2 and 3. In this regard, the integrated circuit 3 includes a rectangular housing 4 having yieldable or flexible contacts 5 on the perimeter or circumferential sides thereof. Also shown on the printed circuit board 1 is a plurality of representative structural parts 8 which may comprise resistors, diodes, etc., that may also be mounted on the printed circuit board 1.

As shown in FIGS. 2 and 3, the integrated circuit 3 is positioned in the opening 2. The circuit 3 may be so positioned in the opening 2 by pressing it in the direction of the arrow shown in FIG. 2. This this regard, the opening 2 is slightly smaller than the outer dimensions of the circuit 3 and contacts 5. The contacts 5 serve to bend and are biased against or clampingly engage the sides of the opening 2. The force exerted by the contacts 5 in this regard is sufficient to maintain the circuit's 3 position in the opening 2 for purposes of soldering without the need for additional supporting structures.

In this regard, simple and known soldering methods can be utilized such as wave soldering without the use of additional soldering supports. On the reverse or lower portion of the printed circuit board typical soldering paths are provided along with integrated conductors 6. The contacts 5 and respective integrated conductors 6 are soldered together with the printed circuit board 1.

FIG. 3 is an enlarged and partially sectional view of area III shown in FIG. 2. In this regard, the engagement of yielding contact 5 of the integrated circuit 3 with the wall of the opening 2 is clearly seen. In addition, there is shown the area of contact or soldering location 7 between the conductors 6 on the printed circuit board 1 and contacts 5 of the integrated circuit 3 where soldering has occurred coupling the same.

Thus it is apparent that the present invention provides a relatively simple yet effective means of mounting an integrated circuit on a printed circuit board and although a preferred embodiment has been disclosed and described in detail herein, its scope should not be limited thereby, rather its scope should be determined by that of the appended claims.

What is claimed is:

1. A method of incorporating an integrated circuit into a printed circuit board having conductors thereon, wherein said integrated circuit includes a housing having a plurality of yieldable contacts rigidly mounted on its perimeter, said method comprising:
    (a) providing said integrated circuit;
    (b) providing a printed circuit board;
    (c) providing an opening in the printed circuit board slightly smaller than the outer dimensions of the housing and contacts of the integrated circuit;

(d) placing the integrated circuit in the opening of the printed circuit board such that the contacts are biased against or clampingly engage the sides of the opening so as to maintain the integrated circuit in position therein; and (e) soldering the contacts with respective conductors on the printed circuit board.

2. The method in accordance with claim 1 which includes the step of providing said opening by stamping said printed circuit board.

3. The method in accordance with claim 2 which includes the step of providing an opening which is rectangular in shape and an integrated circuit of similar shape.

4. The method in accordance with claim 3 which includes the step of pressing said integrated circuit into said opening such that it is relatively flush with the printed circuit board on the side at which soldering takes place.

5. The method in accordance with claim 4 which includes the step of soldering said contacts and conductors by wave soldering.

6. The method in accordance with claim 1 which includes the step of soldering said contacts and conductors by wave soldering.

* * * * *